(12) United States Patent
Okada et al.

(10) Patent No.: US 11,519,069 B2
(45) Date of Patent: Dec. 6, 2022

(54) POLYCRYSTALLINE SILICON MANUFACTURING APPARATUS

(71) Applicant: Shin-Etsu Chemical Co., Ltd., Tokyo (JP)

(72) Inventors: Tetsuro Okada, Niigata (JP); Naruhiro Hoshino, Niigata (JP); Masahiko Ishida, Niigata (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 49 days.

(21) Appl. No.: 16/936,346

(22) Filed: Jul. 22, 2020

(65) Prior Publication Data
US 2021/0025077 A1      Jan. 28, 2021

(30) Foreign Application Priority Data

Jul. 25, 2019   (JP) .............................. JP2019-137105

(51) Int. Cl.
| | | |
|---|---|---|
| *C23C 16/458* | (2006.01) | |
| *C30B 29/06* | (2006.01) | |
| *C30B 35/00* | (2006.01) | |
| *C01B 33/035* | (2006.01) | |
| *C23C 16/24* | (2006.01) | |
| *C23C 16/455* | (2006.01) | |
| *H01R 4/00* | (2006.01) | |

(52) U.S. Cl.
CPC .......... *C23C 16/458* (2013.01); *C01B 33/035* (2013.01); *C23C 16/24* (2013.01); *C23C 16/45563* (2013.01); *C30B 29/06* (2013.01); *C30B 35/007* (2013.01); *H01R 4/00* (2013.01)

(58) Field of Classification Search
CPC .................................................... C23C 16/458
See application file for complete search history.

(56) References Cited

U.S. PATENT DOCUMENTS

| | | | | |
|---|---|---|---|---|
| 4,469,428 | A * | 9/1984 | Yoshioka | ........... G03G 15/0291 |
| | | | | 399/311 |
| 9,698,578 | B1 * | 7/2017 | Jackson | ................. H01R 4/302 |
| (Continued) | | | | |

FOREIGN PATENT DOCUMENTS

| | | | | |
|---|---|---|---|---|
| JP | 2002338226 | A1 | 11/2002 | |
| JP | 2006016243 | * | 1/2006 | ............. C01B 33/02 |
| (Continued) | | | | |

OTHER PUBLICATIONS

Office Action for Japanese Application No. 2019-137105 dated May 24, 2022 (machine translation by Global Dossier).

*Primary Examiner* — Keath T Chen
(74) *Attorney, Agent, or Firm* — Ladas & Parry, LLP

(57) ABSTRACT

A polycrystalline silicon manufacturing apparatus according to the present invention may comprise an electrode adapter that electrically connects a core wire holder and a metal electrode, wherein the electrode adapter may be non-conductive with respect to a screwing part formed in the metal electrode. A polycrystalline silicon manufacturing apparatus according to the present invention may comprise an electrode adapter that electrically connects a core wire holder and a metal electrode, wherein the electrode adapter may be fixed to the metal electrode by a fixing mechanism part, and the electrode adapter may be non-conductive with respect to the fixing mechanism part.

4 Claims, 7 Drawing Sheets

(56) References Cited

U.S. PATENT DOCUMENTS

| | | | | |
|---|---|---|---|---|
| 2008/0087641 | A1* | 4/2008 | De La Llera | H01J 37/32449 |
| | | | | 438/689 |
| 2010/0038131 | A1* | 2/2010 | Belton | H01B 17/306 |
| | | | | 174/650 |
| 2010/0229796 | A1 | 9/2010 | Endoh et al. | |
| 2011/0206479 | A1* | 8/2011 | Sexton | H01J 37/32908 |
| | | | | 411/395 |
| 2012/0222619 | A1* | 9/2012 | Netsu | C23C 16/458 |
| | | | | 118/723 R |
| 2014/0242410 | A1* | 8/2014 | Kim | H01L 31/182 |
| | | | | 427/125 |
| 2016/0045886 | A1* | 2/2016 | Kraus | C01B 33/035 |
| | | | | 427/532 |
| 2017/0341944 | A1* | 11/2017 | Ishida | C01B 33/035 |
| 2021/0269316 | A1* | 9/2021 | Ishikawa | C01B 33/035 |

FOREIGN PATENT DOCUMENTS

| | | | |
|---|---|---|---|
| JP | 2007146519 | A | 6/2007 |
| JP | 2010235438 | A1 | 10/2010 |
| JP | 2011027182 | A | 2/2011 |
| JP | 2011111360 | A | 6/2011 |
| JP | 2017067253 | A | 4/2017 |

\* cited by examiner

--PRIOR ART--

POLYCRYSTALLINE SILICON MANUFACTURING APPARATUS

CROSS-REFERENCE TO RELATED APPLICATION

The present application claims priority to Japanese Patent Application No, 2019-137105 filed on Jul. 25, 2019, the disclosure of which is incorporated herein by reference in its entirety.

BACKGROUND

Technical Field

An embodiment of the present invention relates to a polycrystalline silicon manufacturing apparatus by a Siemens method, and more specifically to a structure of an electrode adapter that electrically connects a core wire holder and a metal electrode.

Related Art

A polycrystalline silicon is a raw material of a single crystal silicon for manufacturing a semiconductor or a silicon for manufacturing a solar cell. As a method for manufacturing a polycrystalline silicon, a Siemens method is known. In this method, in general, a silane-based source gas is brought into contact with a heated silicon core wire to deposit a polycrystalline silicon on a surface of the silicon core wire by a chemical vapor deposition (CVD) method.

In the Siemens method, two silicon core wires in the vertical direction and one silicon core wire in the horizontal direction are assembled into an inverted U shape. Both ends of the set of inverted U-shaped silicon core wires are connected to a core wire holder and fixed to a pair of metal electrodes disposed on a base plate, respectively. Generally, a reaction furnace includes a plurality of sets of inverted U-shaped silicon core wires. Such a configuration is disclosed in, for example, JP 2010-235433 A.

When an inverted U-shaped silicon core wire is heated to a deposition temperature by conduction and a mixed gas of, for example, trichlorosilane and hydrogen as a source gas is brought into contact with the silicon core wire, a polycrystalline silicon vapor-phase grows on the silicon core wire, and a polycrystalline silicon rod having a desired diameter is formed in an inverted U shape.

An electrode penetrates a base plate with an insulator interposed between the electrode and the base plate, and is connected to another electrode or connected to a power source disposed outside a reaction furnace. In order to prevent deposition of a polycrystalline silicon on this electrode during a polycrystalline silicon deposition step, to prevent metal contamination of the polycrystalline silicon being deposited by a temperature rise of the electrode/and the like, the electrode, the base plate, and a bell jar are cooled by a refrigerant such as water.

FIG. 1 is a conceptual diagram for exemplifying an aspect in which an electrode adapter is attached to an electrode to hold a core wire holder in a conventional technique. In the example illustrated in this drawing, a metal electrode 20 and a carbon core wire holder 24 are connected to each other via an electrode adapter 23, for example, for the purpose of suppressing wear of the electrode 20, and the electrode adapter 23 is fixed to the electrode 20 by screwing.

A current is supplied from the electrode 20 to a silicon core wire (not illustrated) held on a top of a core wire holder 24 via the core wire holder 24, and a surface of the silicon core wire is heated to about 900° C. to 1200° C. in a hydrogen atmosphere by Joule heat. In this state, a mixed gas of, for example, trichlorosilane and hydrogen as a source gas is supplied into a reaction furnace. A high-purity silicon is thereby vapor-grown on the silicon core wire to grow a polycrystalline silicon rod.

During this step, as the diameter of the polycrystalline silicon rod increases, deposition of a polycrystalline silicon also progresses on a side of the carbon core wire holder 24, and the polycrystalline silicon gradually becomes integrated with the core wire holder 24. Note that electric resistance decreases as the polycrystalline silicon rod grows. Therefore, a current to be supplied is gradually increased in order to maintain the surface temperature of the polycrystalline silicon rod at a temperature suitable for the deposition reaction.

Generally, a large current of 2000 to 4000 amperes is supplied to the polycrystalline silicon rod at an end of the deposition reaction. As the diameter of the polycrystalline silicon rod increases, the amount of heat released from a surface of the rod increases. Therefore, in order to maintain a temperature required for the deposition reaction (900 to 1200° C.), it is necessary to increase electric energy to be supplied to the polycrystalline silicon rod so as to compensate the amount of heat lost due to the heat release.

Under these circumstances, a structure that can withstand the above-described supply of a large current and the increased weight of the polycrystalline silicon rod due to an increase in the diameter is required for connecting the metal electrode, the electrode adapter, and the core wire holder to each other.

SUMMARY

Therefore, it is necessary to securely fix the electrode adapter because the electrode adapter is made of carbon having a high self-lubricating property. In particular, when the metal electrode and the adapter are connected to each other by screwing, if there is looseness of a screw, discharge may occur from a gap generated due to the looseness to damage both of the metal electrode and the adapter, and a metal and carbon diffused in the reaction furnace due to the discharge may cause contamination into polycrystalline silicon.

Regarding the connection among the metal electrode, the electrode adapter, and the core wire holder, a novel structure has been proposed so far.

For example, JP 2010-235438 A discloses an aspect in which a core rod holding portion having a holding hole into which a silicon core wire is inserted at an upper end thereof and having a screwing stripe on a peripheral surface thereof is fixed by a holder having a female screw hole to be screwed with the core rod holding portion. In this aspect, both the core rod holding portion and the holder are made of a conductive material, and a current also flows through a screwing part. However, the present inventors have found that discharge occurs in a slight gap of a screwing part generated by, for example, a difference in thermal expansion coefficient between a metal electrode and a carbon electrode adapter when a large current flows in the screwing part by a recent increase in the diameter of the screwing part because the screwing part has an uneven surface even if the core rod holding portion is sufficiently engaged with a holder.

Note that JP 2010-235436 A also discloses an aspect in which a lower part of a core rod holding portion is inserted into a holding hole of a holder main body, and the core rod holding portion is supported by a bottom plate part using a nut member to be screwed with the holder main body having a male screw on an outer peripheral surface thereof. However, since these members are also conductive as in the above-described aspect, the present inventors have found that also in this aspect, discharge easily occurs when a large current flows in a screwing part as described above.

JP 2002-338226 A discloses an aspect in which a stand supporting a lower end of a seed is supported by a first cradle made of a male screw member, and the first cradle is supported by a fixed second cradle made of a female screw member so as to move up and down. However, since the first and second cradles are both conduction paths, the present inventors have found that discharge occurs due to flow of a large current in a screwing part as in the aspect disclosed in JP 2010-235438 A.

As described above, the structure connecting an electrode adapter to a metal electrode in the conventional technique does not have sufficient countermeasures against discharge. Therefore, once damage occurs to a member inside a furnace due to discharge, a post-treatment is extremely troublesome. Specifically, an electrode needs to be replaced with a new one, and a polycrystalline silicon rod is also contaminated. In addition, as a result of contamination of a bell jar and a base plate, a hydrocarbon compound is contained as impurities also in a reaction exhaust gas that is collected and circulated, which adversely affects manufacture of a polycrystalline silicon in subsequent batches.

The present invention has been achieved in view of such a problem, and an object of the present invention is to provide a novel structure of an electrode adapter that is simple but can be stably conductive with respect to a metal electrode and a core wire holder.

[Concept 1]

A polycrystalline silicon manufacturing apparatus according to the present invention may be a polycrystalline silicon manufacturing apparatus, which manufactures a polycrystalline silicon by a Siemens method, comprising an electrode adapter that electrically connects a core v/ire holder and a metal electrode, wherein the electrode adapter may be non-conductive with respect to a screwing part formed in the metal electrode.

[Concept 2]

A polycrystalline silicon manufacturing apparatus according to the present invention may be a polycrystalline silicon manufacturing apparatus, which manufactures a polycrystalline silicon by a Siemens method, comprising an electrode adapter that electrically connects a core wire holder and a metal electrode, wherein the electrode adapter may be fixed to the metal electrode by a fixing mechanism part, and the electrode adapter may be non-conductive with respect to the fixing mechanism part.

[Concept 3]

In the polycrystalline silicon manufacturing apparatus according to concept 1 or 2, wherein the electrode adapter and the core wire holder may be made of an identical material.

[Concept 4]

In the polycrystalline silicon manufacturing apparatus according to any one of concepts 1 to 3, at least one of the electrode adapter and the core wire holder may be made of a carbon material.

[Concept 5]

In the polycrystalline silicon manufacturing apparatus according to any one of concepts 1 to 4, a conductive member may be inserted between conductive parts of the electrode adapter and the metal electrode.

[Concept 6]

In the polycrystalline silicon manufacturing apparatus according to any one of concepts 1 to 5, the electrode adapter may be fixed to the metal electrode via an insulating jig.

[Concept 7]

In the polycrystalline silicon manufacturing apparatus according to any one of concepts 2 to 6, an insulating treatment may be applied to at least a surface of the fixing mechanism part.

An embodiment of the present invention provides an electrode adapter that can be stably conductive with respect to a metal electrode and a core wire holder. Moreover, since the structure is extremely simple, it is easy to remove the core wire holder.

DETAILED DESCRIPTION

Figure 2:
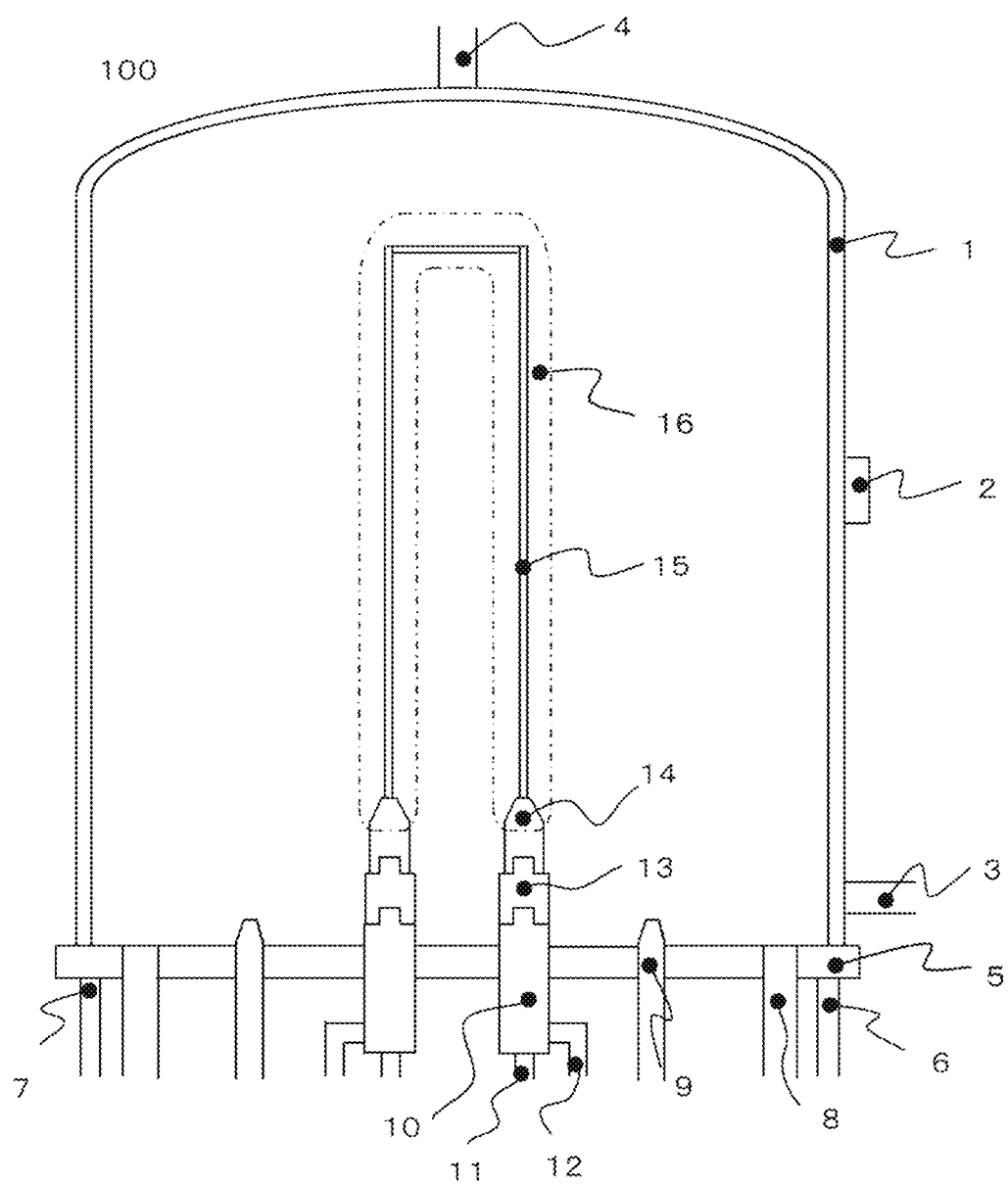
FIG. 2 is a schematic diagram for explaining a configuration example of a polycrystalline silicon manufacturing apparatus according to an embodiment of the present invention.

FIG. 2 is a diagram illustrating an outline of a configuration example of a reaction furnace of a polycrystalline silicon manufacturing apparatus according to an embodiment of the present invention. A reaction furnace 100 includes an electrode 10 insulated from a base plate 5 disposed under a bell jar 1 on the base plate 5. The electrode 10 is connected to an electrode adapter 13 via a fixing mechanism part 17 (see FIGS. 3 to 6) made of an insulating material, and a carbon core wire holder 14 holding a silicon core wire 15 is fixed to the electrode adapter 13. Connection is made such that a current supplied from the electrode 10 passes through the electrode adapter 13 and the core wire holder 14, and a polycrystalline silicon 16 is deposited on the silicon core wire 15 by a reaction of a source gas.

Note that a reference numeral 2 in FIG. 2 indicates a viewing window. A refrigerant for cooling the bell jar 1 is supplied from a refrigerant inlet 3 and discharged from a refrigerant outlet 4 to the outside of the furnace. A refrigerant for cooling the base plate 5 is supplied from a refrigerant inlet 6 and discharged from a refrigerant outlet 7 to the outside of the furnace. A refrigerant for cooling the electrode 10 is supplied from a refrigerant inlet 11 and discharged from a refrigerant outlet 12 to the outside of the furnace. A deposition source gas of a polycrystalline silicon is supplied from a source gas supply nozzle 9 and discharged from a reaction exhaust gas outlet 8 to the outside of the furnace.

FIGS. 3 to 6 are conceptual diagrams each illustrating an aspect in which an electrode adapter included in the polycrystalline silicon manufacturing apparatus according to an embodiment of the present invention is attached to an electrode to hold a core wire holder.

Figure 3:
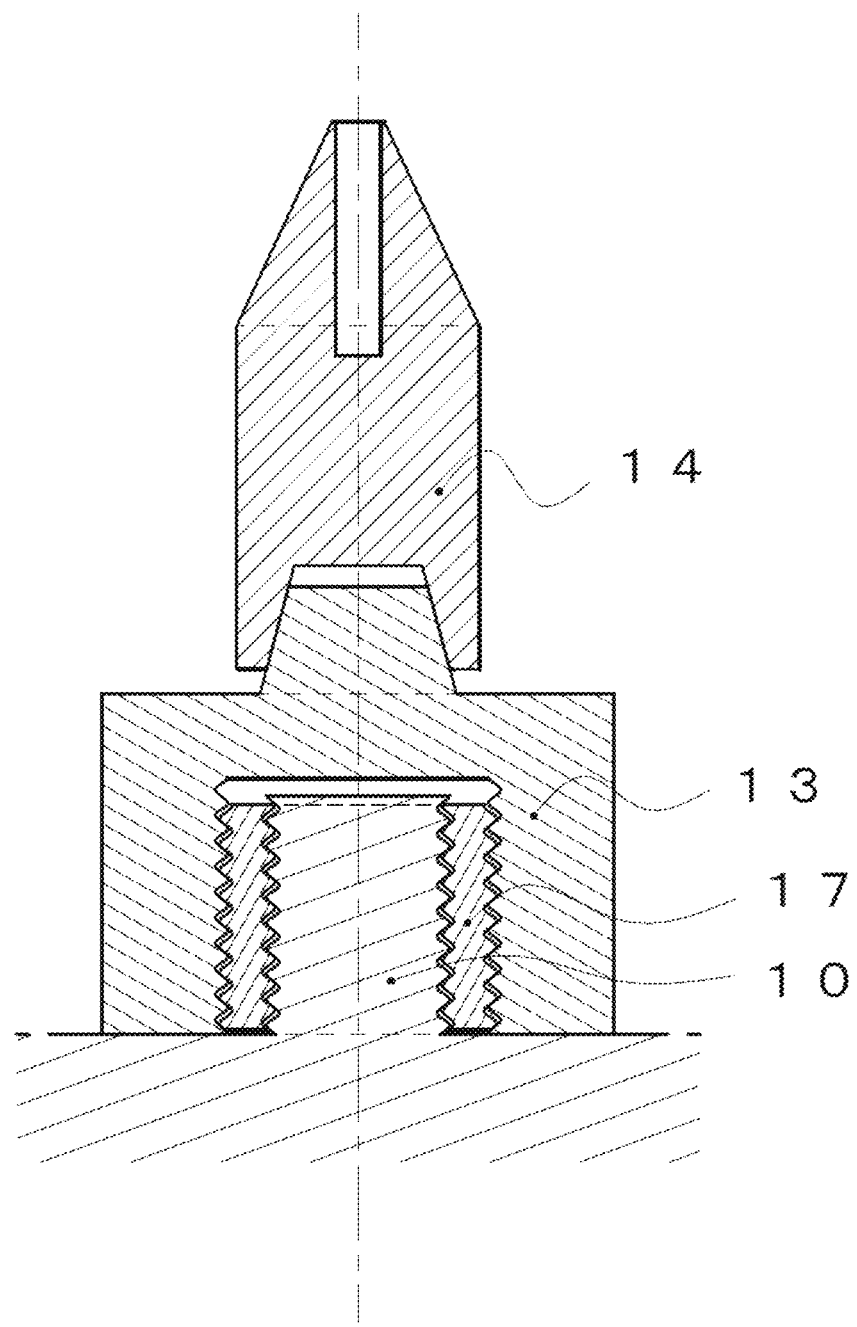
FIG. 3 is a conceptual diagram illustrating an aspect in which an electrode adapter is attached to an electrode to hold a core wire holder.

In the aspect illustrated in FIG. 3, a screwing part is formed on a top of the electrode 10. The electrode adapter 13 is fixed via the fixing mechanism part 17 screwed with this screwing part. A recess formed at a lower end of the core wire holder 14 is fitted into a protrusion formed on a top of this electrode adapter 13. Since the fixing mechanism part 17 is made of an insulating material, the screwing part is non-conductive, and power is supplied from the electrode 10 to the core wire holder 14 via a part of the electrode adapter 13 other than the screwing part. As a result, it is possible to completely suppress conduction in the screwing part where discharge easily occurs (a portion having an extremely uneven surface), and to prevent damage due to discharge.

Figure 4:
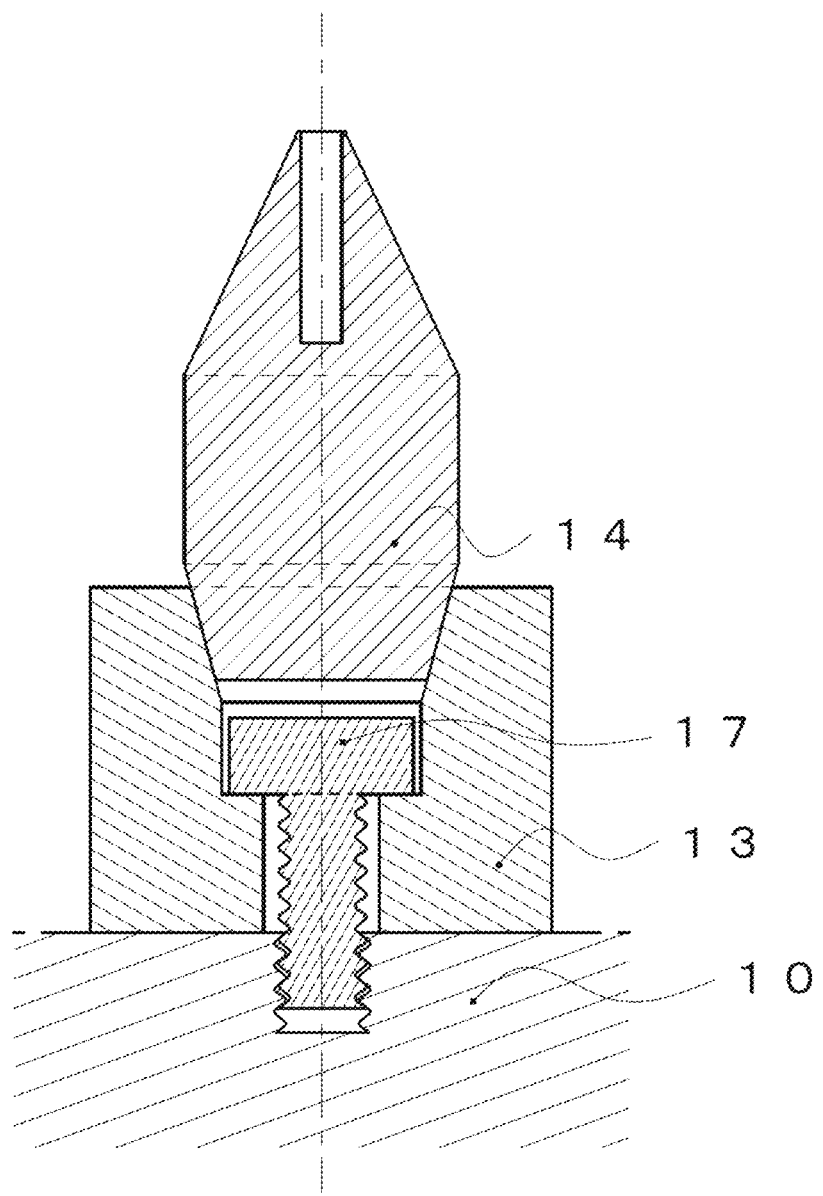
FIG. 4 is a conceptual diagram illustrating another aspect in which an electrode adapter is attached to an electrode to hold a core wire holder.

In the aspect illustrated in FIG. 4, a hole having a screwing part (female screw) is formed on a top of the electrode 10, and the fixing mechanism part 17 having a screwing part (male screw) is screwed with this hole portion. The electrode adapter 13 is fixed by this fixing mechanism part 17, and a protrusion formed at a lower end of the core wire holder 14 is fitted into a recess formed on a top of this electrode adapter 13. Since this fixing mechanism part 17 is also made of an insulating material, the screwing part is non-conductive, and power is supplied from the electrode 10 to the core wire holder 14 via a part of the electrode adapter 13 other than the screwing part. As a result, it is possible to completely suppress conduction in the screwing part where discharge easily occurs (a portion having an extremely uneven surface), and to prevent damage due to discharge.

Figure 5:
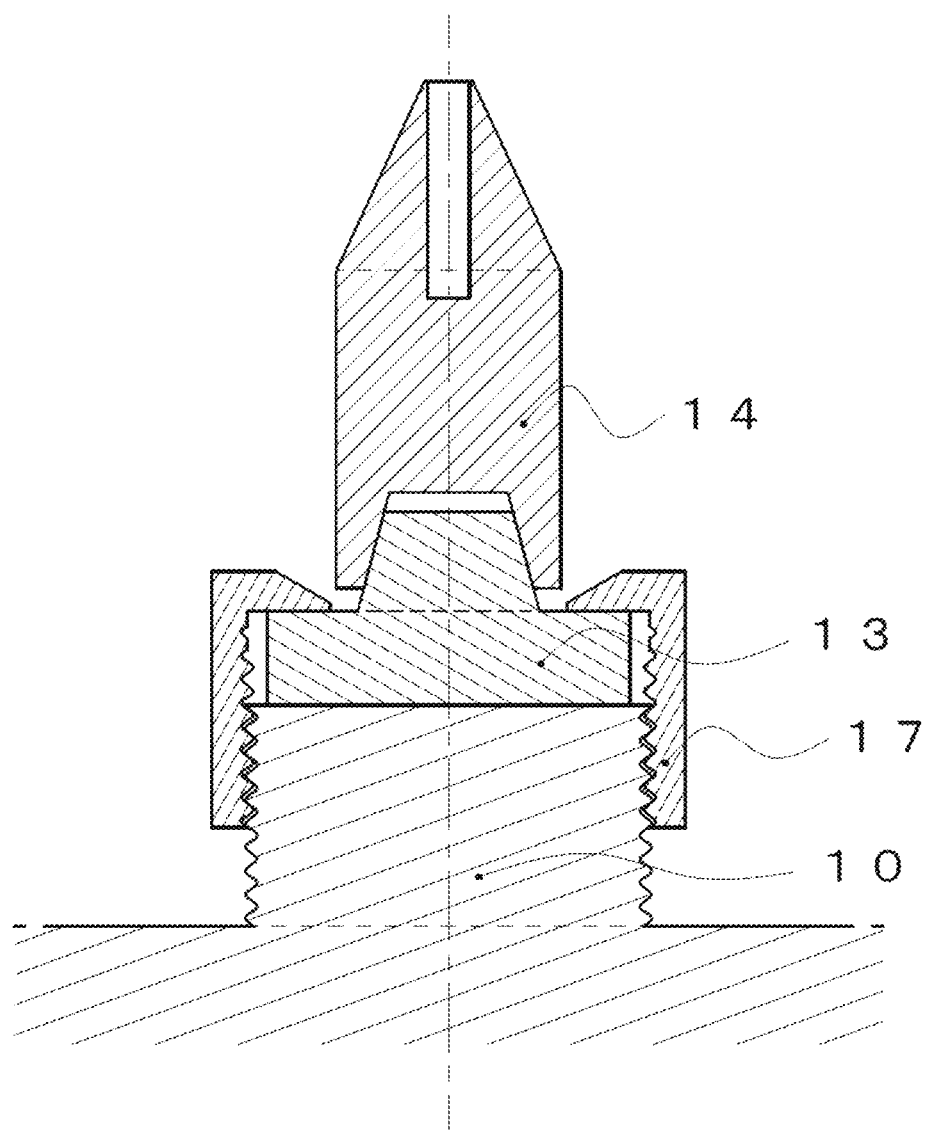
FIG. 5 is a conceptual diagram illustrating another aspect in which an electrode adapter is attached to an electrode to hold a core wire holder.

In the aspect illustrated in FIG. 5, a screwing part (male screw) is formed on a top of the electrode 10, and the electrode adapter 13 is disposed on a top of this screwing part (male screw). The electrode adapter 13 is fixed by the fixing mechanism part 17 having a screwing part on an inner surface thereof, and a recess formed at a lower end of the core wire holder 14 is fitted into a protrusion formed on a top of this electrode adapter 13. Since this fixing mechanism part 17 is also made of an insulating material, the screwing part is non-conductive, and power is supplied from the electrode 10 to the core wire holder 14 via a part of the electrode adapter 13 other than the screwing part. As a result, it is possible to completely suppress conduction in the screwing part where discharge easily occurs (a portion having an extremely uneven surface), and to prevent damage due to discharge.

Figure 6:
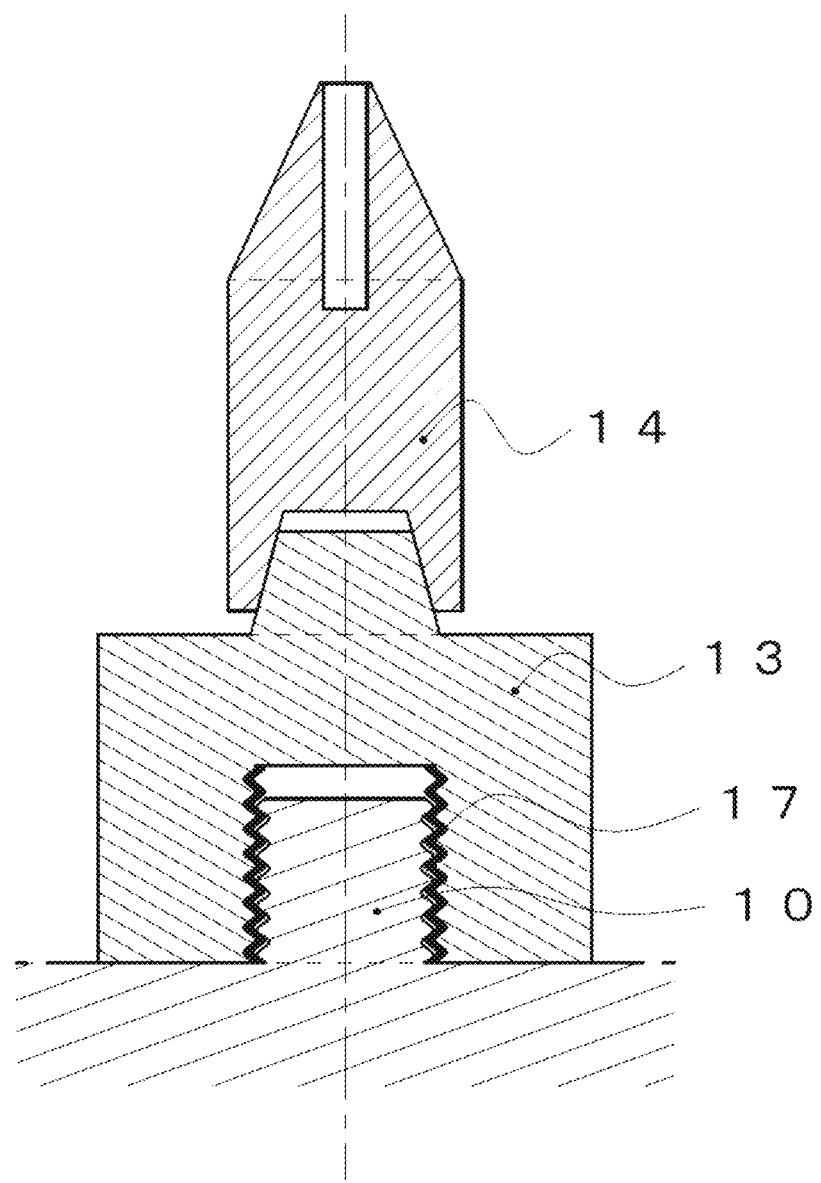
FIG. 6 is a conceptual diagram illustrating another aspect in which an electrode adapter is attached to an electrode to hold a core wire holder.
Figure 7:
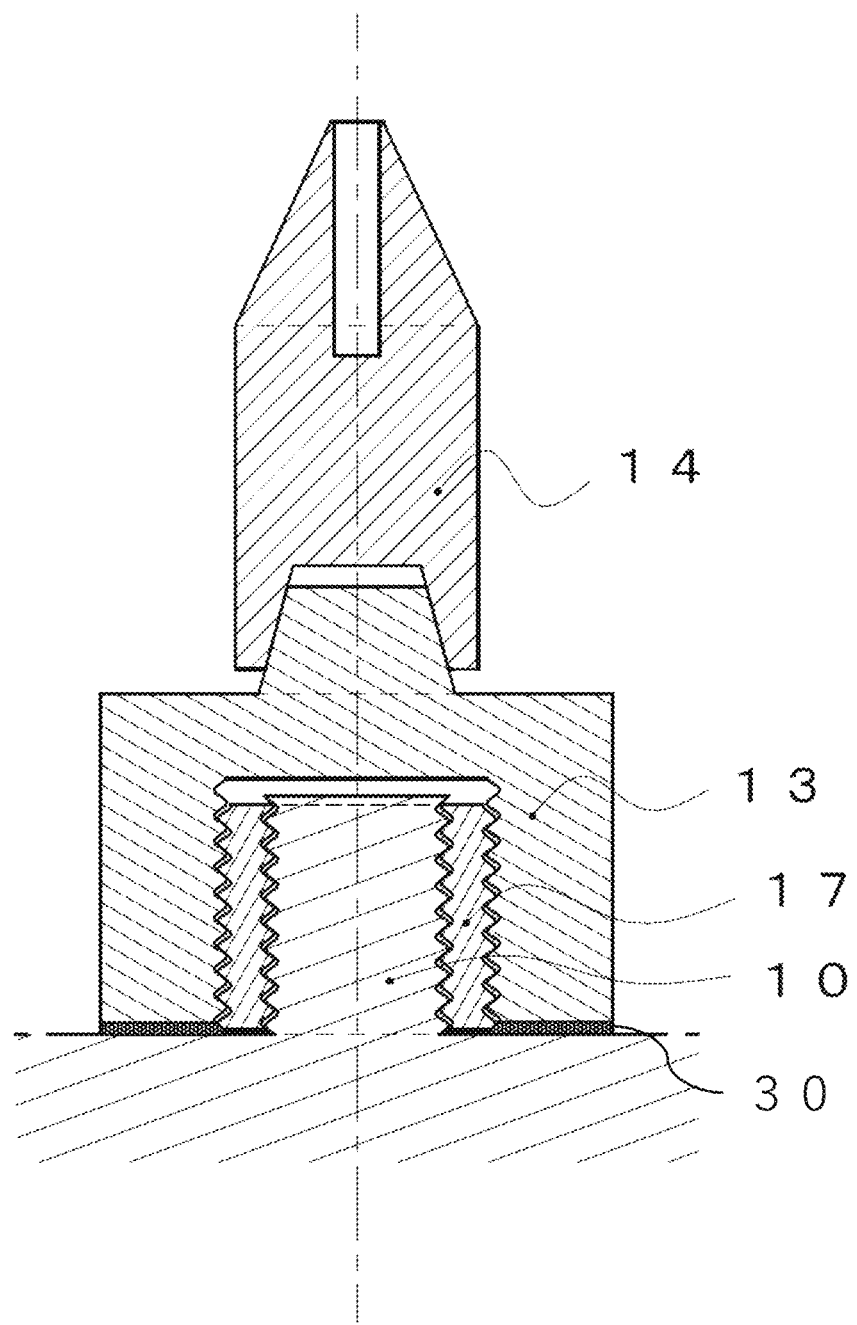
FIG. 7 is a conceptual diagram illustrating a conductive member inserted between conductive parts of an electrode adapter and a metal electrode.

In the aspect illustrated in FIG. 6, a screwing part (male screw) is formed on a top of the electrode 10. With this screwing part, a screwing part formed on an inner surface of the electrode adapter 13 is screwed via the insulating fixing mechanism part 17. Note that in this case, an insulating treatment may be applied to the screwing part formed on the inner surface of the electrode adapter 13 such that the inner surface region of the electrode adapter 13 functions as the fixing mechanism part 17. A protrusion is formed on a top of the electrode adapter 13, and a recess formed at a lower end of the core wire holder 14 is fitted into this protrusion. Also in this case, since the fixing mechanism part 17 is made of an insulating material, the screwing part is non-conductive, and power is supplied from the electrode 10 to the core wire holder 14 via a part of the electrode adapter 13 other than the screwing part. As a result, it is possible to completely suppress conduction in the screwing part where discharge easily occurs (a portion having an extremely uneven surface), and to prevent damage due to discharge.

As described above, an embodiment of the present invention provides a polycrystalline silicon manufacturing apparatus, which manufactures a polycrystalline silicon by a Siemens method, including an electrode adapter that electrically connects a core wire holder and a metal electrode, in which the electrode adapter is non-conductive with respect to a screwing part formed in the metal electrode.

In addition, an embodiment of the present invention provides a polycrystalline silicon manufacturing apparatus, which manufactures a polycrystalline silicon by a Siemens method, including an electrode adapter that electrically connects a core wire holder and a metal electrode, in which the electrode adapter is fixed to the metal electrode by a fixing mechanism part, and the electrode adapter is non-conductive with respect to the fixing mechanism part.

In this case, the electrode adapter and the core wire holder may be made of the same material.

In addition, at least one of the electrode adapter and the core wire holder may be made of a carbon material. When connecting parts of the core wire holder and the electrode adapter are made of carbon, contact surfaces become familiar by sliding the core wire holder and the electrode adapter when the core wire holder and the electrode adapter are set. Therefore, even if the connecting parts of the core wire holder and the electrode adapter each have a simple tapered shape, sufficient fixing can be achieved, and discharge can be effectively suppressed.

Note that in order to supply power to the core wire holder efficiently, a conductive member 30 such as a carbon sheet may be inserted into between conductive parts of the electrode adapter and the metal electrode.

As in the aspect illustrated in FIG. 5, the electrode adapter may be fixed to the metal electrode via an insulating jig.

Note that the entire fixing mechanism part may be made of an insulating material, but an insulating treatment may be applied to at least a surface of the fixing mechanism part.

Note that the above insulating material only needs to have an electric resistivity sufficiently higher than carbon (about 10 μΩm). Examples of such a material include silicon nitride (about $1\times10^{15}$ μΩm) and quartz glass (about $1\times10^{18}$ μΩm). A material having an electric resistivity almost the same as germanium (about $5\times10^5$ μΩm) can also be used as the above insulating material.

Examples

Figure 1:
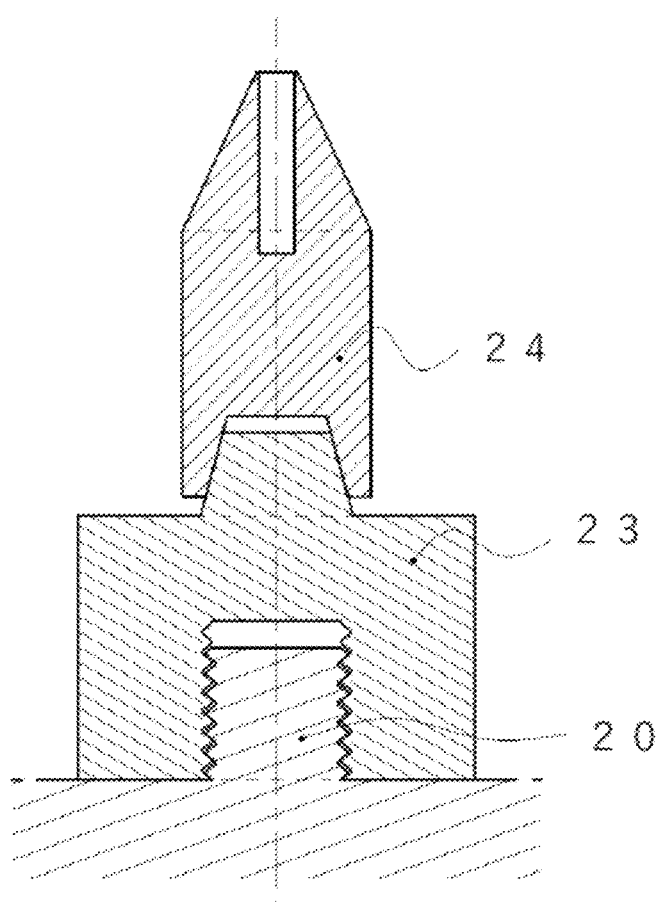
FIG. 1 is a conceptual diagram for exemplifying an aspect in which an electrode adapter is attached to an electrode to hold a core wire holder in a conventional technique.

A reaction to grow a polycrystalline silicon until the weight of a pair of polycrystalline silicon rods reached 80 to 200 kg was performed for 20 batches by a Siemens method, and it was confirmed whether a metal electrode had a defect considered to have been generated by discharge. As a result, in a case of using the configuration illustrated in FIG. 3 (in which the fixing mechanism part is made of silicon nitride), no defect was observed in the metal electrode. Meanwhile, in a case of using the configuration illustrated in FIG. 1, broken parts were observed in two batches corresponding to 10%, and in these batches in which the breakage occurred, defects considered to have been generated by discharge were confirmed in screw threads of the metal electrodes.

An embodiment of the present invention provides an electrode adapter that can be stably conductive with respect to a metal electrode and a core wire holder.

REFERENCE SIGNS LIST

1 Bell jar
2 Viewing window
3 Refrigerant inlet (bell jar)
4 Refrigerant outlet (bell jar)
5 Base plate
6 Refrigerant inlet (base plate)
7 Refrigerant outlet (base plate)
8 Reaction exhaust gas outlet
9 Source gas supply nozzle
10, 20 Metal electrode
11 Refrigerant inlet (electrode)
12 Refrigerant outlet (electrode)
13, 23 Electrode adapter
14, 24 Core wire holder
15 Silicon core wire
16 Polycrystalline silicon
17 Fixing mechanism part
30 Conductive member
100 Reaction furnace

What is claimed is:

1. A polycrystalline silicon manufacturing apparatus, which is configured to manufacture a polycrystalline silicon by a Siemens method, comprising:
    a metal electrode;
    a core wire holder;
    an electrode adapter that is configured to electrically connect the core wire holder and the metal electrode; and
    a fixing mechanism part, which is entirely provided below the core wire holder and entirely provided between the core wire holder and the metal electrode, the fixing mechanism part having a screwing part which is configured to penetrate to the metal electrode and fix the electrode adapter to the metal electrode,
    wherein an upper surface of the fixing mechanism part and a lower surface of the core wire holder are separated from each other and a gap is configured to exist between the upper surface of the fixing mechanism part and the lower surface of the core wire holder,
    wherein the screwing part is made of an insulating material; and
    wherein a carbon sheet is provided between the electrode adapter and the metal electrode.

2. The polycrystalline silicon manufacturing apparatus according to claim 1, wherein the electrode adapter and the core wire holder are made of an identical material.

3. The polycrystalline silicon manufacturing apparatus according to claim 1, wherein at least one of the electrode adapter and the core wire holder is made of a carbon material.

4. The polycrystalline silicon manufacturing apparatus according to claim 1, wherein the fixing mechanism part is made of silicon nitride, quartz glass or germanium.

* * * * *